United States Patent
Neitemeier et al.

(10) Patent No.: US 12,225,848 B2
(45) Date of Patent: Feb. 18, 2025

(54) SENSOR SYSTEM FOR RECORDING ELEMENTS OF A FLOW OF HARVESTED MATERIAL

(71) Applicant: CLAAS Selbstfahrende Erntemaschinen GmbH, Harsewinkel (DE)

(72) Inventors: Dennis Neitemeier, Lippetal (DE); Joachim Baumgarten, Beelen (DE); Andreas Wilken, Bissendorf (DE); Bastian Bormann, Gütersloh (DE); Johann Witte, Fröndenberg (DE)

(73) Assignee: CLAAS Selbstfahrende Erntemaschinen GmbH, Harsewinkel (DE)

( * ) Notice: Subject to any disclaimer, the term of this patent is extended or adjusted under 35 U.S.C. 154(b) by 854 days.

(21) Appl. No.: 17/324,367

(22) Filed: May 19, 2021

(65) Prior Publication Data
US 2021/0360852 A1 Nov. 25, 2021

(30) Foreign Application Priority Data
May 20, 2020 (DE) .......................... 102020113658.7

(51) Int. Cl.
*A01D 41/127* (2006.01)
*A01F 12/44* (2006.01)
(Continued)

(52) U.S. Cl.
CPC ..... *A01D 41/1272* (2013.01); *A01D 41/1276* (2013.01); *A01F 12/446* (2013.01);
(Continued)

(58) Field of Classification Search
CPC ............ A01D 41/1272; A01D 41/1273; A01D 41/1277; A01F 12/446; G01D 5/2403; G01D 5/2405; G01D 5/241; G01F 23/263
See application file for complete search history.

(56) References Cited

U.S. PATENT DOCUMENTS 3,606,745 A * 9/1971 Girodat .............. A01D 41/1273
460/7
3,739,266 A * 6/1973 Neitzel .............. G01R 27/2635
324/665

(Continued)

FOREIGN PATENT DOCUMENTS

DE 19934881 A1 1/2001
DE 102015213037 A1 2/2016
(Continued)

OTHER PUBLICATIONS

JP_H09159500_A_-_English_translation, Jun. 20, 1997.*
European Search Report for European application No. 21162056.2-1004 mailed Sep. 2, 2021.

*Primary Examiner* — Thomas B Will
*Assistant Examiner* — Julia C Tran
(74) *Attorney, Agent, or Firm* — Lempia Summerfield Katz LLC

(57) ABSTRACT

A sensor system for counting elements of a flow of harvested material. The sensor system comprises an oscillating circuit and a measuring device, wherein the oscillating circuit comprises at least one capacitive component with a capacitance and an inductive component with an inductance. The oscillating circuit has a resonance frequency which depends on the capacitance and the inductance. Further, the capacitive component is positioned in the region of the flow of harvested material, so that the capacitance is influenced by individual elements of the flow of harvested material. The measuring device is configured to determine the resonance
(Continued)

frequency of the oscillating circuit. In this way, the sensor system is configured to deduce at least one property of the particular element of the flow of harvested material from the resonance frequency of the oscillating circuit.

16 Claims, 7 Drawing Sheets

(51) Int. Cl.
  *G01D 5/24* (2006.01)
  *G01D 5/241* (2006.01)
  *G01F 23/263* (2022.01)

(52) U.S. Cl.
  CPC ......... *G01D 5/2403* (2021.05); *G01D 5/2405* (2013.01); *G01D 5/241* (2013.01); *G01F 23/263* (2013.01)

(56) References Cited

U.S. PATENT DOCUMENTS

| | | | | |
|---|---|---|---|---|
| 3,935,866 A * | 2/1976 | Northup | ............. | A01D 41/1273 56/DIG. 15 |
| 4,337,611 A * | 7/1982 | Mailander | .......... | A01D 41/1274 56/DIG. 15 |
| 4,782,282 A * | 11/1988 | Bachman | ............... | A01C 7/105 340/684 |
| 5,046,362 A * | 9/1991 | Strubbe | ............. | A01D 41/1273 340/684 |
| 6,249,130 B1 * | 6/2001 | Greer | .................... | G01N 27/226 324/687 |
| 6,437,582 B1 * | 8/2002 | Rode | .................. | A01D 41/1277 73/335.04 |
| 7,367,880 B2 * | 5/2008 | Hoskinson | ......... | A01D 41/1277 460/4 |
| 10,212,883 B2 | 2/2019 | Quincke | | |
| 10,620,023 B2 | 4/2020 | Brandmeier et al. | | |
| 2003/0080753 A1 * | 5/2003 | Rains | ................. | A01D 41/1208 324/643 |
| 2003/0214310 A1 * | 11/2003 | McIntosh | ............. | G01N 27/223 324/658 |
| 2005/0208987 A1 * | 9/2005 | Ho | ....................... | A01D 41/127 460/1 |
| 2007/0209423 A1 * | 9/2007 | Missotten | .......... | A01D 41/1273 56/10.2 R |
| 2013/0116018 A1 * | 5/2013 | Ricketts | ............... | A01D 75/282 460/9 |
| 2014/0174199 A1 * | 6/2014 | Strnad | .................... | G01G 11/00 73/861.73 |
| 2015/0285752 A1 * | 10/2015 | Kozicki | ................ | B65G 43/00 324/649 |
| 2016/0025531 A1 * | 1/2016 | Bischoff | ................ | G01L 1/146 73/861.73 |
| 2016/0029558 A1 | 2/2016 | Dybro et al. | | |
| 2018/0242522 A1 * | 8/2018 | Duquesne | ............. | A01F 12/444 |

FOREIGN PATENT DOCUMENTS

| | | |
|---|---|---|
| EP | 3222133 A1 | 9/2017 |
| EP | 3301407 A1 | 4/2018 |
| JP | H09159500 A | 6/1997 |

* cited by examiner

SENSOR SYSTEM FOR RECORDING ELEMENTS OF A FLOW OF HARVESTED MATERIAL

CROSS-REFERENCE TO RELATED APPLICATION

This application claims priority under 35 U.S.C. § 119 to German Patent Application No. DE 102020113658.7 filed May 20, 2020, the entire disclosure of which is hereby incorporated by reference herein.

TECHNICAL FIELD

The invention relates to a sensor system for recording elements of a flow of harvested material, such as in an agricultural production machine.

BACKGROUND

Recording a grain count of a flow of harvested material is disclosed in U.S. Pat. No. 10,212,883, incorporated by reference herein in its entirety. In this context, grains that strike an impact surface of the sensor may be recorded using a measuring signal.

Determining a mass flow is disclosed in U.S. Pat. No. 10,620,023, incorporated by reference herein in its entirety.

DESCRIPTION OF THE FIGURES

The present application is further described in the detailed description which follows, in reference to the noted drawings by way of non-limiting examples of exemplary implementation, in which like reference numerals represent similar parts throughout the several views of the drawings, and wherein.

DETAILED DESCRIPTION

Figure 1:
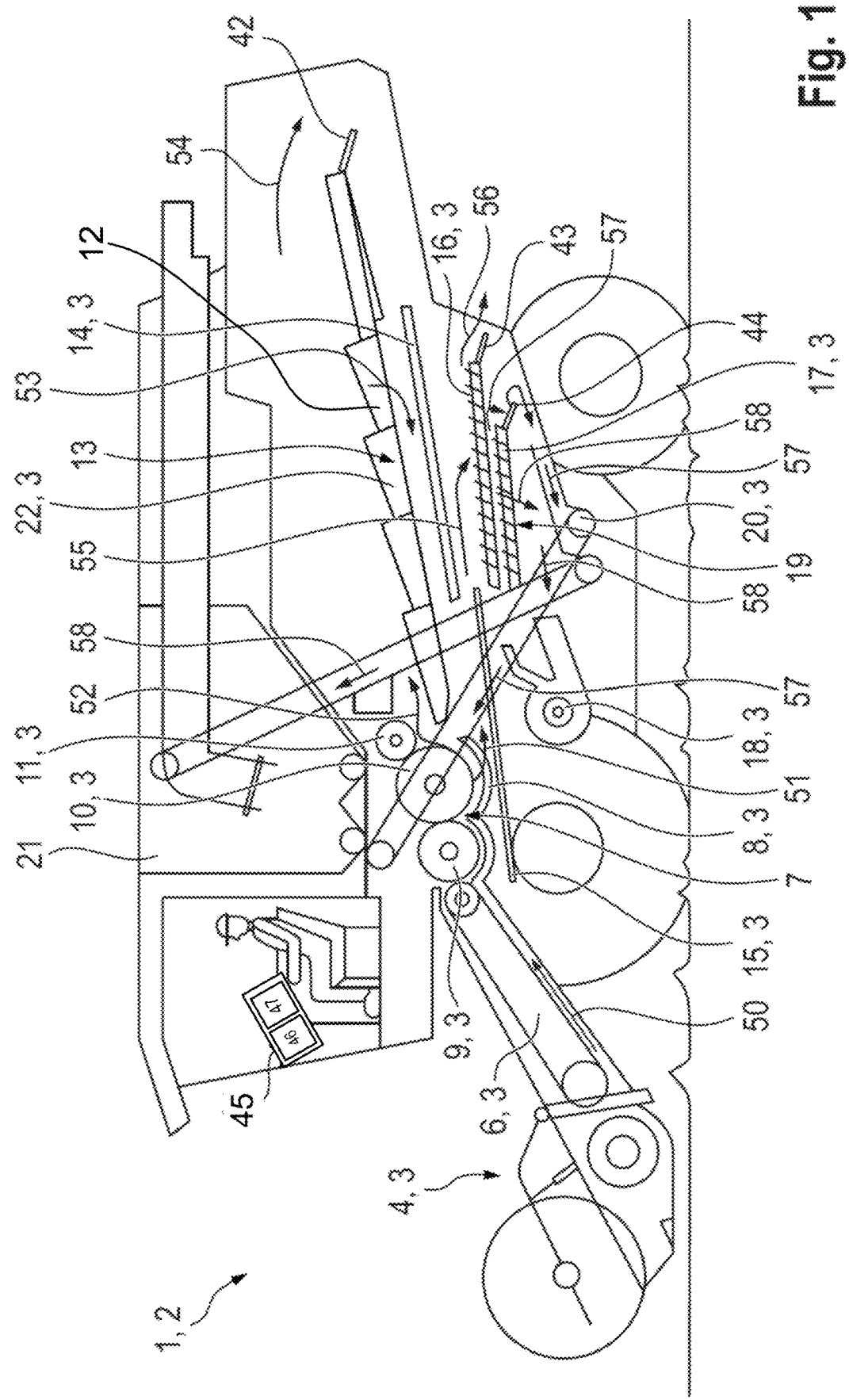
FIG. 1 illustrates a combine with a straw walker.

As discussed in the background, grains that strike an impact surface of the sensor may be recorded using a measuring signal; however, the sensor may not be capable of recognizing which type of elements strike the impact surface of the sensor. Further, force may be measured that exerts a mass flow on a sensor; however, the sensor may not be capable of recognizing which elements are exerting the force.

Thus, in one or some embodiments, a sensor is provided that supplies more information on the recorded elements (such as at least one aspect of the element, including the type of element).

This may be achieved by a sensor system for recording elements of a flow of harvested material, such as in an agricultural production machine. The sensor system may comprise an oscillating circuit and a measuring device, wherein the oscillating circuit comprises (or consists of) at least one capacitive component with a capacitance and at least one inductive component with an inductance, wherein the oscillating circuit has a resonance frequency, wherein the resonance frequency depends on the capacitance and the inductance, wherein the measuring device is provided and configured to determine the resonance frequency of the oscillating circuit, wherein the capacitive component(s) is/are arranged or positioned in the region of the flow of harvested material, wherein the capacitive component(s) are configured so that the capacitance is influenced or determined by individual elements of the flow of harvested material, and wherein at least a part of the sensor system is provided and configured to deduce at least one property of the particular element (e.g., a type of the element) of the flow of harvested material from the resonance frequency of the oscillating circuit.

In one or some embodiments, the sensor system is configured to measure the effect of the element of the flow of harvested material on the capacitance of the capacitive component(s). By changing the capacitance, the resonance frequency of the oscillating circuit is changed. In turn, the change in the resonance frequency or the capacitance may be measured, and at least one aspect of the element of the flow of harvested material may therefore be recorded and/or identified. The recorded and/or identified elements of the flow of harvested material may then be counted.

In one or some embodiments, the inductive component may be integrated in the measuring device, such as, for example, in the form of an integrated circuit. When the inductance is known, the capacitance may be directly inferred from the resonance frequency. Specifically, based on the change in the resonance frequency, the change in the capacitance may therefore also be determined.

The level or amount of the change in capacitance and the resonance frequency may depend on the permittivity of the element of the flow of harvested material. By determining the resonance frequency, the sensor system is capable of or configured to infer the permittivity of the element or some other indicator of the ability of the element to interact with an electric field. In one or some embodiments, the permittivity of the element is the product of the dielectric constant of the element and the permittivity of a perfect vacuum, which is defined to be about $8.854 \times 10^{-12}$ farad per meter. Thus, the permittivity may also be termed the permittivity or dielectric constant.

In one or some embodiments, the sensor system is provided and configured to distinguish between grain elements and non-grain elements, such straw elements. Grain elements may possess a significantly greater permittivity than straw elements. A grain element may therefore change the resonance frequency differently (such as more than) a straw element. Thus, in one or some embodiments, the property of the elements of the flow of harvested material to be distinguished in this case is whether the particular element is a grain element or a straw element.

In one or some embodiments, the measuring device may determine the resonance frequency using a predetermined measuring frequency. By regularly or periodically determining the resonance frequency, the time characteristic of measuring elements of the flow of harvested material may be determined by the sensor system.

In one or some embodiments, the resonance frequency is greater than 1 kHz. The greater the resonance frequency, the faster it may be precisely measured.

In one or some embodiments, the measuring frequency (such as the predetermined measuring frequency) is less than one-tenth of the resonance frequency. Due to the small measuring frequency in comparison to the resonance frequency, at least ten periods of the oscillations of the oscillation circuit may be measured to determine the resonance frequency in each measurement. Consequently, the determination of the resonance frequency may be more precise than if only few periods are measured.

In one or some embodiments, the measuring frequency multiplied by the length of the capacitive component in the direction of movement of the flow of harvested material may be greater than 2 m/s, such as greater than 30 m/s, or such as greater than 40 m/s. The measuring frequency multiplied by the length of the capacitive component in the direction of movement of the flow of harvested material may indicate the speed of movement of the elements of the flow of harvested material that are reliably recorded by the sensor system. With a speed of movement of 2 m/s, grains may be reliably recorded that, separated from the husks, are only accelerated by gravity. This is for example the case in a combine in the shaker or the cleaning screen. With a speed of movement of 10 m/s, grains may be reliably recorded that were accelerated in the combine by the threshing drum or a rotor. With a speed of movement of 25 m/s, grains may be reliably recorded that were accelerated in a forage harvester for ejection.

In one or some embodiments, the sampling frequency is to be distinguished from the measuring frequency. The sampling frequency may indicate how frequently a voltage and/or a current is determined in the oscillating frequency. In one or some embodiments, the sampling frequency is at least twice as large as the resonance frequency expected from the oscillation circuit. In one or some embodiments, the sampling frequency is at least ten times as large as the resonance frequency expected from the oscillation circuit.

In one or some embodiments, the capacitive component is designed as a flat capacitor. The capacitance of a flat capacitor may be influenced by elements in the direct proximity of its surface. A flat capacitor may be mounted at the edge of the flow of harvested material and may detect the elements of the flow of harvested material flowing by. A flat capacitor may interfere with the flow of harvested material less than a plate capacitor with two plates.

In one or some embodiments, the capacitive component is designed as an interdigital capacitor or other type of multi-finger periodic structure. Other capacitive components are contemplated. Over its surface, the interdigital capacitor may have a uniform sensitivity to elements from the flow of harvested material. An element therefore may influence the resonance frequency to the same extent independent of its position.

The capacitive component may also be formed as a plate capacitor. When attaching the plate capacitor to a sieve-like element or device, the plates of the plate capacitor may be attached at two adjacent edges of the outlet of a sieve. The particular outlet may not be restricted by this attachment.

In one or some embodiments, the sensor system is installed in a combine. In this case, the invention relates to a combine having a sieve-like element (or device) and a sensor system, wherein the sensor system comprises an oscillating circuit and a measuring device, wherein the oscillating circuit at least comprises a capacitive component with a capacitance and an inductive component, wherein the capacitive component is attached directly adjacent to the sieve-like element (or device), wherein the sieve-like element (or device) lets traversing elements of a flow of harvested material pass through the capacitive component and at least temporarily change the capacitance of the capacitive component, wherein the measuring device is provided and configured to determine the resonance frequency of the oscillating circuit, and wherein the sensor system is provided and configured to infer at least one property of the particular element (e.g., type of element) of the flow of harvested material from the resonance frequency of the oscillating circuit.

In this case, the sensor system may count elements of the flow of harvested material flowing through the combine (e.g., after identifying respective element(s) as grain element (s) or straw element(s), counting the identified grain elements and/or the identified straw elements).

In one or some embodiments, the capacitive element is arranged or positioned behind the sieve-like element or device in the direction of movement of the flow of harvested material. The sensor system therefore only counts the elements of the flow of harvested material passing through the sieve-like element or device. The elements of the flow of harvested material that are not counted flow by the sieve-like element or device.

In one or some embodiments, the sieve-like element or device is a threshing concave, a flap matrix below a rotor, a shaker, or a cleaning screen. A sieve-like element or device may be distinguished by a lattice structure. The size of the openings may be variable, may vary from element to element, and may optionally be adjustable. Accordingly, the size of the openings in a cleaning screen may be adjustable and may be generally adjusted to a size that is scarcely or slightly larger than the grains that are to be harvested. The openings in a threshing concave are, in contrast, typically of a fixed size and may be significantly larger than the grains (e.g., the openings in the threshing concave may be larger than the size of the openings in the cleaning screen).

In one or some embodiments, the surface normal of the flat capacitor may be oriented substantially perpendicular to the direction of movement of the flow of harvested material. The elements of the flow of harvested material consequently move substantially along the surface of the capacitor. This arrangement combines less or minimal interference with the flow of harvested material with effective counting of the elements of the flow of harvested material.

In one or some embodiments, the capacitive component is attached to a surface of the sieve-like element. When attached directly to the surface of the sieve-like element, the interference with the flow of harvested material is reduced or at a minimum.

Referring to the figures, FIG. 1 schematically shows a self-propelled agricultural production machine 2 designed as a combine 1. The combine 1 has a plurality of working units 3 for conveying and/or processing the harvested material (not shown).

The harvested material is collected by an attachment 4 and guided in a supplied flow of harvested material 50 using an inclined conveyor 6 to the threshing system 7. The threshing system 7 comprises a threshing concave 8, an acceleration drum 9, a threshing drum 10, and a deflection drum 11. A first separation of freely moving grains (not shown) in the form of a first flow of harvested material 51 occurs in the threshing concave 8.

Figure 4:
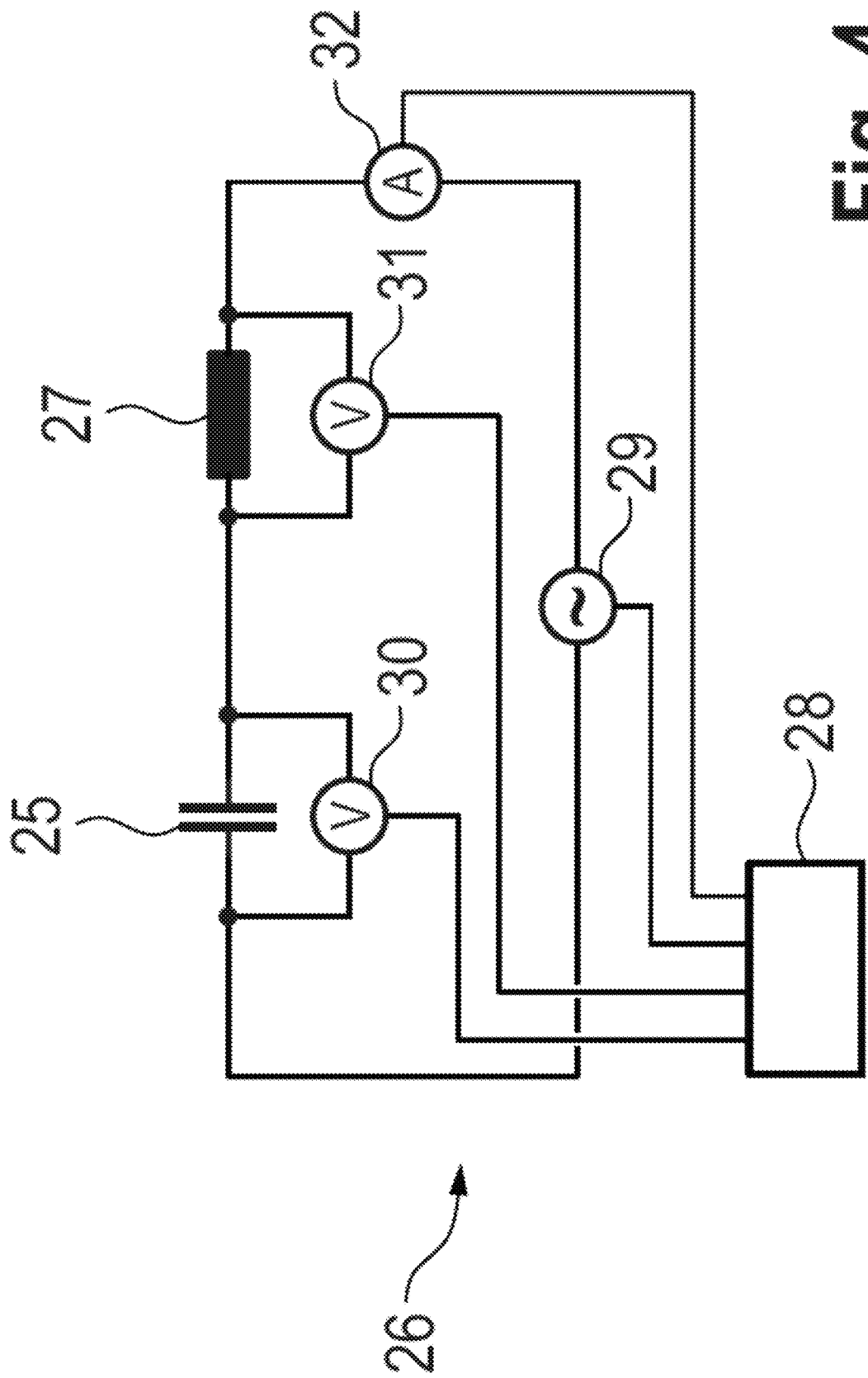
FIG. 4 illustrates a schematic diagram of a sensor system for recording elements of a flow of harvested material.

After passing through the threshing system 7, a second flow of harvested material 52 exiting therefrom that contains stalk parts and non-threshed grains are fed to a separating unit 13 designed as a straw walker 12. The freely moving grains still contained in the second flow of harvested material 52 are separated using the straw walker 12 resulting in a third flow of harvested material 53 to a returns pan 14 and a grain pan 15. The remaining fourth flow of harvested material 54 primarily comprising (or consisting of) stalk parts is conveyed out of the harvester 2. In so doing, the fourth flow of harvested material 54 traverses a first lost grain counter 42. In one or some embodiments, the lost grain counter 42 comprises sensor system 26, as shown in FIG. 4. A capacitor, such as a flat interdigital capacitor, is attached to a flat surface over which the fourth flow of harvested material flows. The sensor system 26 records the elements of the flow of harvested material and is configured to distinguish between grain and non-grain elements.

In one or some embodiments, the system relates not only to a combine 1 with a separating unit 13 designed as a straw walker 12; instead, it is contemplated that the system may also be a combine 1 with separating rotors or other separating units 13.

Both the first and third flows of harvested material 51, 53 primarily containing grains that leave the threshing concave 8 as well as the straw walker 12 are combined into a fifth flow of harvested material 55 by the returns pan 14 and the grain pan 15 and fed to a cleaning unit 19 comprising (or consisting of) a plurality of screening levels 16, 17 and a blower 18. The grains of the fifth flow of harvested material 55 are cleaned here and separated from non-grain components such as, for example, chaff and stalk parts in the form of a sixth flow of harvested material 56 and conveyed out of the harvesting machine 2. In so doing, the sixth flow of harvested material 56 traverses a second lost grain counter 43. In one or some embodiments, the second lost grain counter 43 comprises sensor system 26, as shown in FIG. 4. In one or some embodiments, the functioning of second lost grain counter 43 is identical to the functioning of the first lost grain counter 42.

The described combine 1 also has a return auger 20 through which an incompletely threshed seventh flow of harvested material 57 may again be fed to the threshing system 7. The seventh flow of harvested material 57 traverses a returns grain counter 44 along its path to the return auger 20. In one or some embodiments, the returns grain counter 44 comprises sensor system 26, as shown in FIG. 4. In one or some embodiments, the functioning of returns grain counter 44 is identical to the functioning of the first lost grain counter 42.

A cleaned eighth flow of harvested material 58 comprising (or consisting of) grains is fed to a grain tank 21. The shown flows of harvested material 50-58 are not to be considered exhaustive and may depend on the technical configuration of the harvester 2. In this regard, fewer, greater, or different flows of harvested material are contemplated.

In one or some embodiments, at least one sensor system is used. In particular, at the sieve-like elements (e.g., at any one, any combination, or all of the threshing concave 8, the shaker and the screening levels 16, 17), the depicted combine 1 has a plurality of sensor systems. The elements of the flows of harvested material passing through the sieve-like elements 8, 12, 16, 17 are counted by the sensor systems. In so doing, the sensor systems distinguish between two different elements, such as between grain elements and straw elements.

Using a plurality of sensor systems, it may be distinguished how many grains are separated and how much straw passes through the sieve-like elements 8, 12, 16, 17 at which sieve-like element 8, 12, 16, 17. From this, it may be concluded how effective the particular working units 9, 10, 11, 12, 16, 17 are working. In particular, the sensor systems may identify an aspect (such as the number) of straw passing through the sieve-like elements 8, 12, 16, 17), with another system identifying an aspect (such as the number) of the grains separated. The two different aspects may be compared in order to identify how effective the particular working units 9, 10, 11, 12, 16, 17 are operating (e.g., a percentage based on the number of straw passing through versus the number of grains separated). As discussed above, the electronics to determine how effective the particular working units are operating may be performed in various places. Merely by way of example, respective sensor(s) may count the number(s) of the grain elements and/or straw elements. The sensor(s) may then output the number(s) of the grain elements and/or straw elements to another device, such as to control unit 45. In turn, control unit 45 may perform the comparison using processor 46 and/or memory 47 to identify how effective the particular working units 9, 10, 11, 12, 16, 17 are operating (e.g., comparing the counts of one type of element versus another type of element in order to determine the effectiveness or efficiency of a working unit).

A plurality of sensor systems may be distributed over the surface of each sieve-like element. Accordingly, it may for example be identified where on the shaker how many grain elements and straw elements pass into the third flow of harvested material 53. From this, it may be determined if the shaker is properly adjusted and/or if the setting should be changed. Again, this determination as to whether the shaker is properly adjusted may be performed in a variety of devices, such as in control unit 45.

In this regard, the counts from the sensor systems may converge in or be transmitted to a control unit 45 for further analysis (such as comparison) and/or for display. For example, the control unit 45 may output the counts (or an indication of the counts, such as a percentage of relative counts) on a display (not shown) to the user so that the user may adapt the settings of the work units 3. Alternatively, the control unit 45 may make the settings as to the respective working units 3 independently.

Control unit 45 may comprise any type of computing functionality, such as at least one processor 46 (which may comprise a microprocessor, controller, PLA, or the like) and at least one memory 47. The memory may comprise any type of storage device (e.g., any type of memory). Though the processor 46 and memory 47 are depicted as separate elements, they may be part of a single machine, which includes a microprocessor (or other type of controller) and a memory.

The processor 46 and memory 47 are merely one example of a computational configuration. Other types of computational configurations are contemplated. For example, all or parts of the implementations may be circuitry that includes a type of controller, including an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Figure 2:
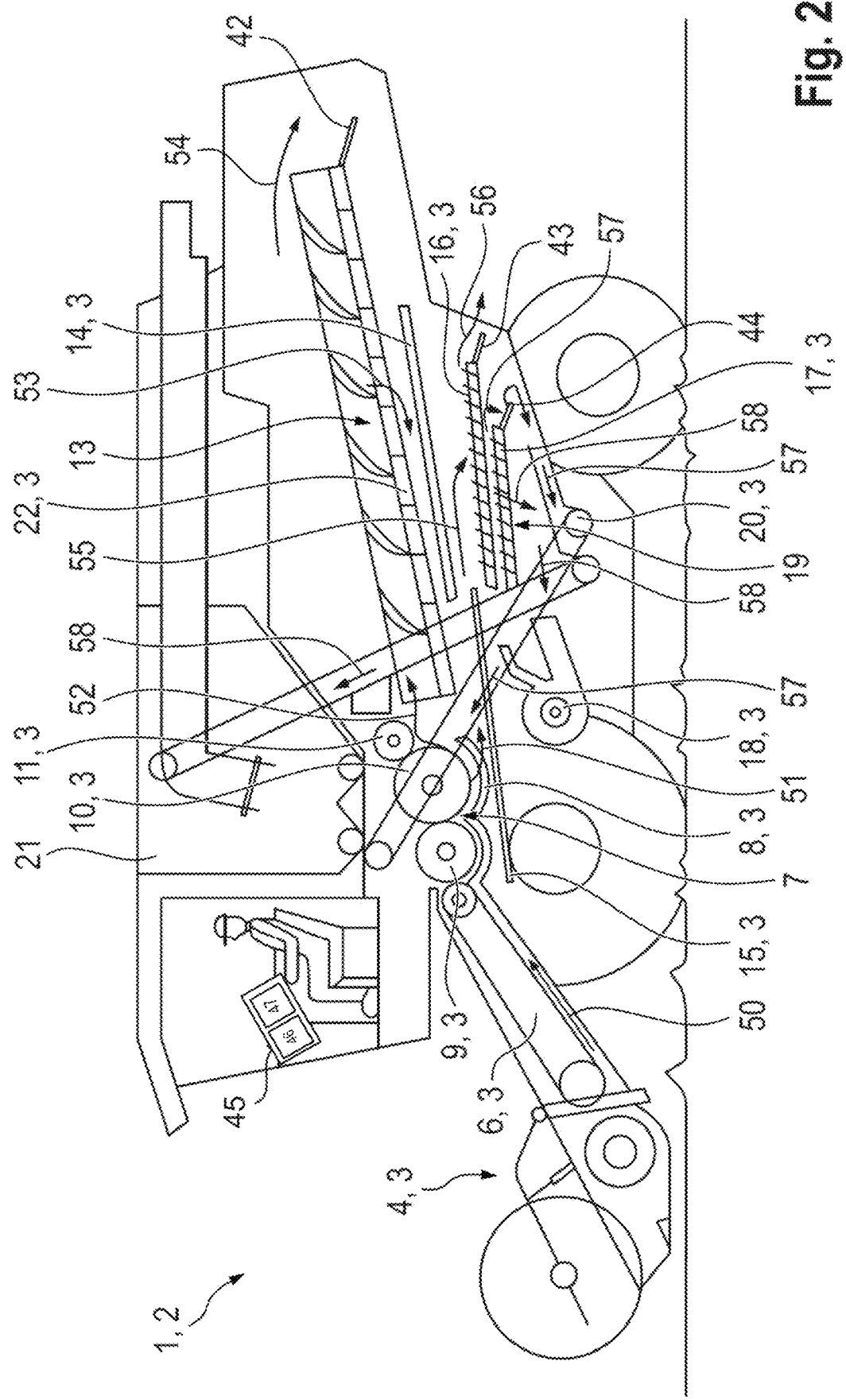
FIG. 2 illustrates a combine with a separating rotor.

FIG. 2 shows an alternative version of a combine 1 with a separating rotor 22. Only the differences from FIG. 1 are explained below. The rotor 22 serves as an alternative to the straw walker 12 and collects the second flow of harvested material 52. The outside of the rotor 22 has a grid structure 23 and is therefore a sieve-like element. The elements of the third flow of harvested material 53 leave the separating rotor through the grid structure 23. Sensors on the grid structure 23 count the elements of the third flow of harvested material 53. The sensors thereby distinguish between grain elements and straw elements.

Figure 3:
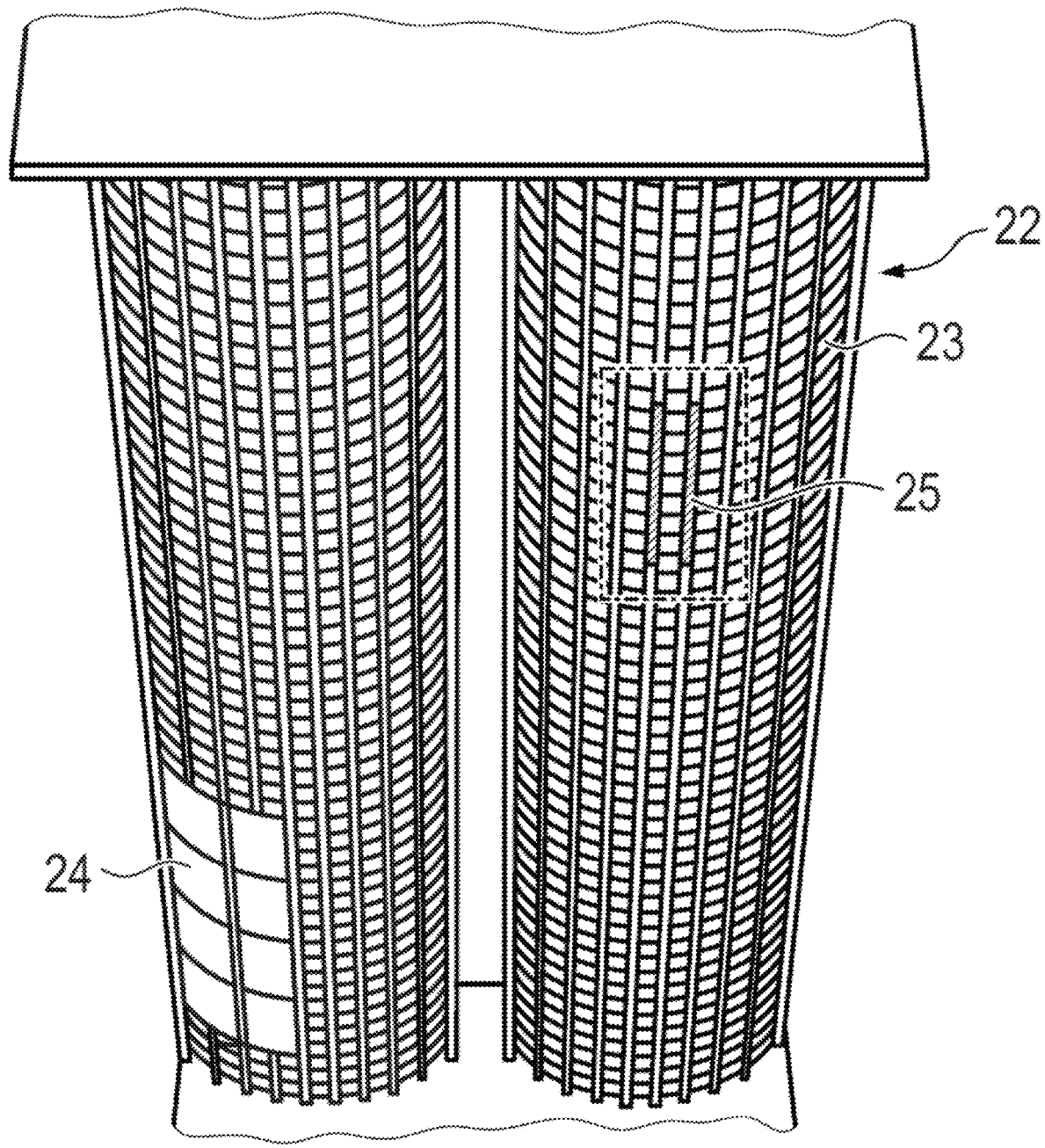
FIG. 3 illustrates a rotor of an axial separator.

FIG. 3 shows a separating rotor 22 of the combine 1 from FIG. 2. In one or some embodiments, a separating rotor 22 is an axial separator. A separating rotor 22 is shown from below in FIG. 3. The outside of the separating rotor 22 has a grid structure 23. Some of the openings in the grid structure 23 may be closed with flaps 24. In one or some embodiments, flat capacitors 25 are attached directly to the grid structure 23. The surface of the capacitors 25 may extend perpendicular to the outside of the cylindrical or axial separator. The elements of the flow of harvested material in the separating rotor 22 typically leave the separating rotor 22 perpendicular to the outside of the separating rotor 22. The surface normal of the capacitor 25 is therefore oriented substantially perpendicular to the direction of movement of the flow of harvested material. Alternatively, or in addition, the flat capacitors 25 may be attached to the surface of the flaps 24. If the flaps 24 are opened, the surface normal of the capacitor 25 is oriented substantially perpendicular to the direction of movement of the flow of harvested material. Depending on the design of the sensor system, the entire sensor system may also be attached directly to one or both of the grid structure 23 or to the flaps 24.

FIG. 4 shows a diagram of a sensor system 26 for recording elements of a flow of harvested material. The sensor system 26 comprises a capacitor 25, an inductive component such as a coil 27, and a measuring device 28. The measuring device 28 excites the oscillating circuit comprising (or consisting of) the capacitor 25 and coil 27 by a voltage source 29 and measures a first voltage 30 across the capacitor 25, a second voltage 31 across the coil 27, and/or the current 32 through the oscillating circuit. It is contemplated that the oscillating circuit may be designed both as a series circuit as well as a parallel circuit.

Figure 5:
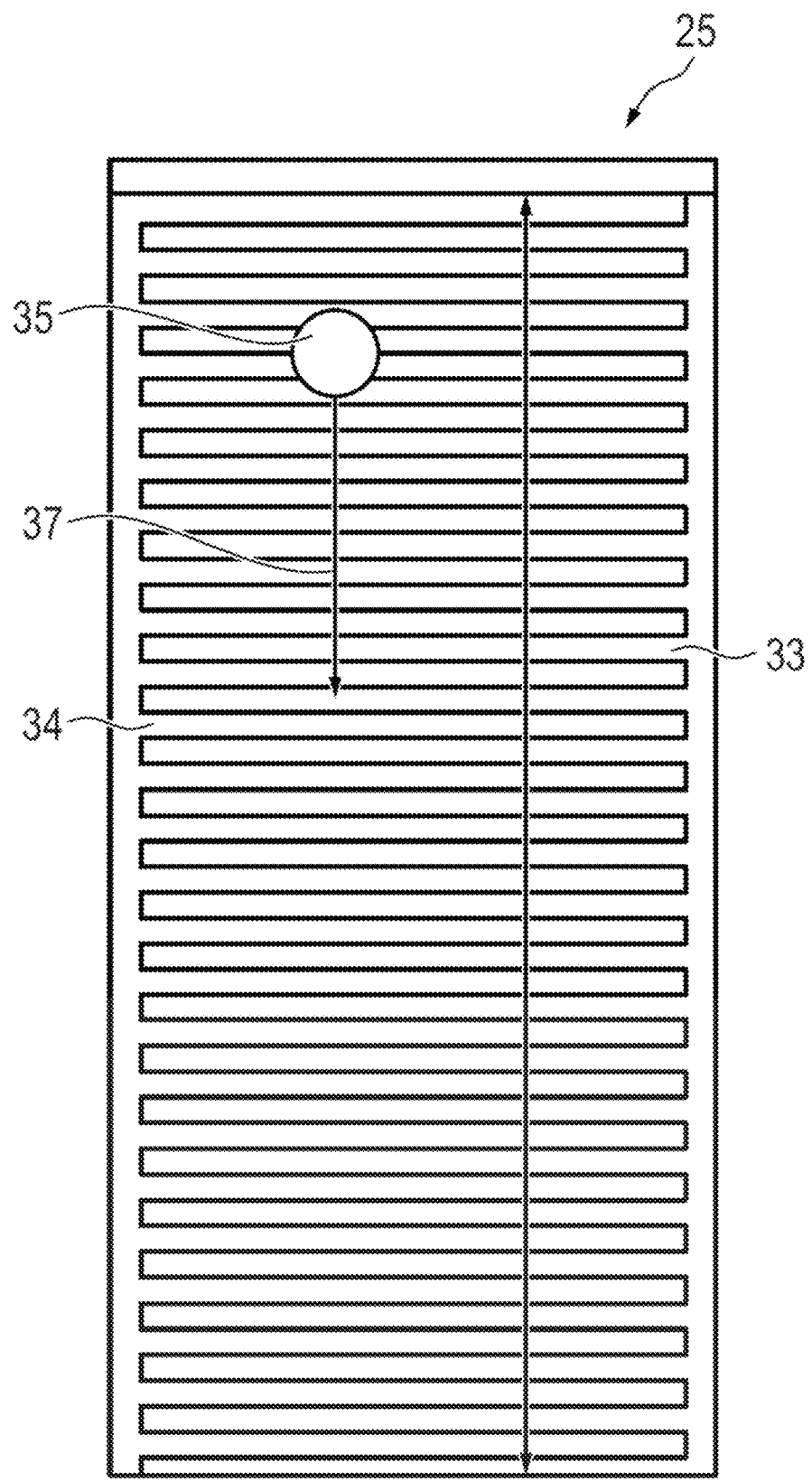
FIG. 5 illustrates an interdigital capacitor.

FIG. 5 shows a diagram of an interdigital capacitor 25. The interdigital capacitor 25 has two electrodes 33, 34. The electrodes 33, 34 each have a plurality of finger-like structures, wherein the finger-like structures overlap with each other. An element 35 from the flow of harvested material influences or affects the capacitance of the interdigital capacitor 25 independent of its position on the surface of the interdigital capacitor 25. The element 35 of the flow of harvested material may therefore be detected over the entire length 36 of the interdigital capacitor 25 in the direction of movement 37 of the flow of harvested material.

Figure 6:
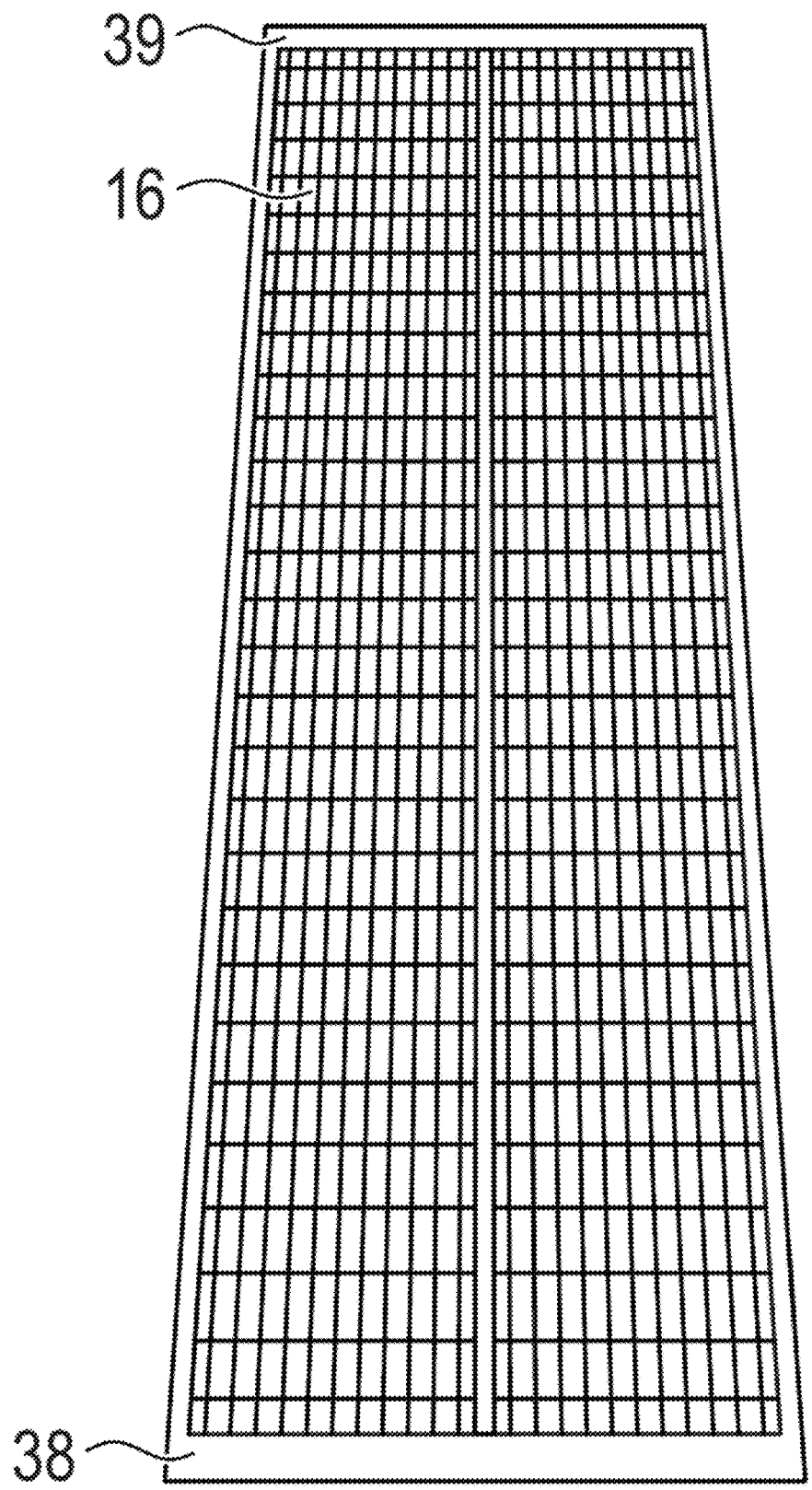
FIG. 6 shows a screening level of the combine.

FIG. 6 shows a screening level 16 of the combine 1. The fifth flow of harvested material 55 may fall from above onto the front end 38 of the screening level 16. The flow of harvested material may be conveyed by cyclical movements of the screening level by throwing movements to the rear end 39 of the screening level 16. In so doing, elements of the flow of harvested material may fall through the grid-like structure of the sieve element.

Figure 7:
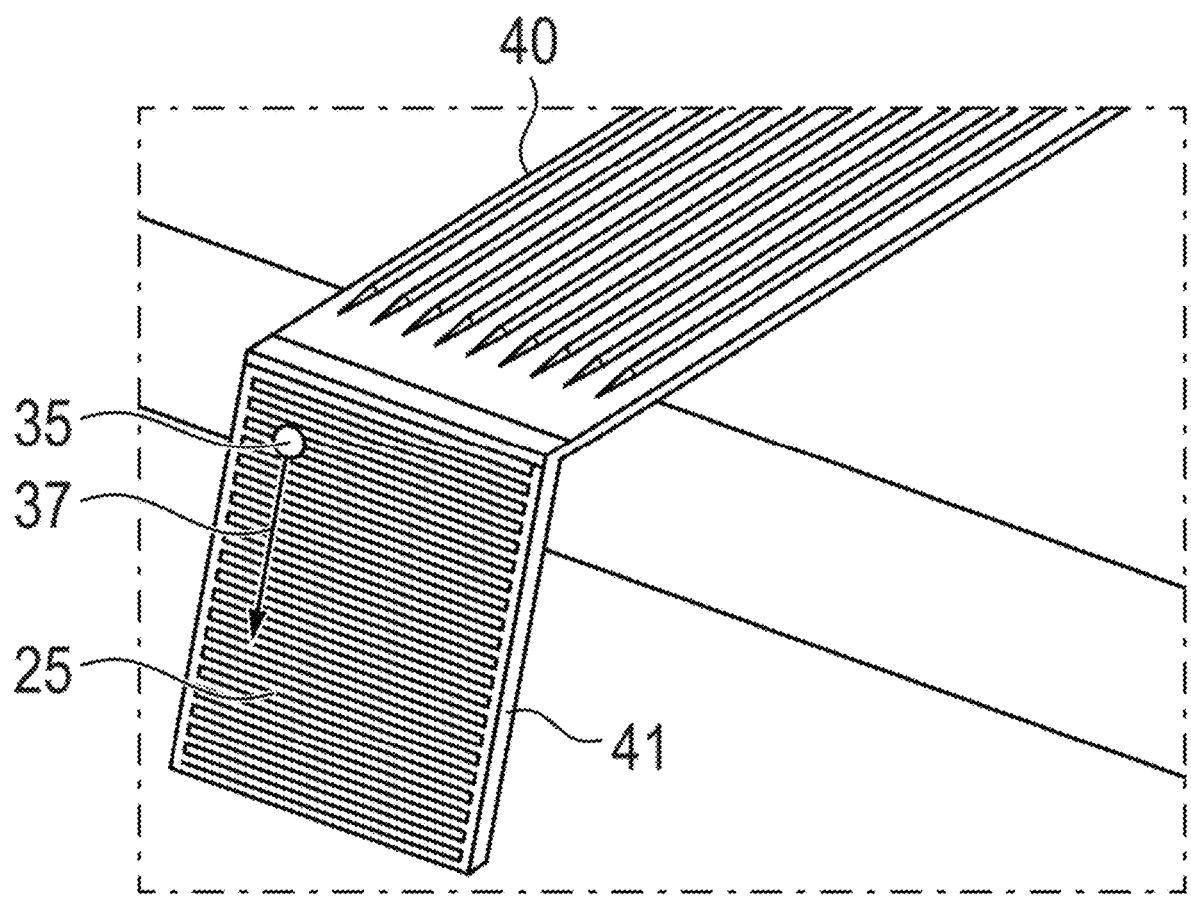
FIG. 7 shows a cross-section of a detail of the screening level.

FIG. 7 shows a cross-section of a detail of the screening level 16. In one or some embodiments, the screening level 16 has movable elements. A top part 40 of the movable element may be tipped from the plane of the screening level 16 into a position that is not in the plane of the screening level 16 (e.g., perpendicular to the plane of the screening level 16). Depending on the angulation of the movable element, the openings in the grid-like structure may be greater or smaller. Thus, the top part 40 may form an angle which is less than 90° from the plane of the screening level 16 (while still forming an angle greater than 0° from the plane of the screening level 16) or may form an angle which is greater than 90° but less than 180° from the plane of the screening level 16. The size of the elements of the harvested material that may pass through the grid-like structure may therefore be determined by the angulation. A bottom part 41 of the movable element is connected at a fixed angle to the top part of the movable element. A capacitor 25 is attached to the bottom part 41 of the movable element. Elements 35 of the flow of harvested material that pass through the openings influence the capacitance of the capacitor 25. In so doing, the direction of movement 37 of the elements is substantially perpendicular to the screening level 16. The capacitor 25 is part of a sensor system 26 shown in FIG. 4. The change in the capacitance of the capacitor is measured by the sensor system 26. The permittivity of the particular element 35 may be deduced from the amount of the change in the capacitance of the capacitor 25. For example, grains can be distinguished from straw elements by the permittivity. As discussed above, the determination of the permittivity may be performed at one or more devices. In one embodiment, the determination of permittivity is performed by the sensor system. Alternatively, or in addition, the determination of permittivity is performed by another electronic device, such as by control unit 45.

In one or some embodiments, each sensor system 26 may comprise a plurality of capacitors 25. The elements of the particular flow of harvested material may be recorded better with smaller capacitors 25 since fewer elements are measured simultaneously during a measurement. In one or some embodiments, only one element is in the measuring range for each count. If there are several elements during a measurement, the influence of the elements is added to the capacitance of the capacitor, and the number and type of elements is correspondingly calculated. In order for as many elements as possible of the particular flow of harvested material to be recorded, it is advantageous to choose a higher measuring frequency when the capacitor surfaces are small. It is likewise advantageous to choose a higher measuring frequency when the speed of movement of the flow of harvested material is higher. If the measuring frequencies are too small, elements of the flow of harvested material between two measurements may move over the capacitor without being detected by the sensor systems. The sizes of the capacitors and the speeds of movement of the flows of harvested material are known to the manufacturer of the agricultural harvester, and may therefore preset corresponding measuring frequencies.

Further, it is intended that the foregoing detailed description be understood as an illustration of selected forms that the invention can take and not as a definition of the invention. It is only the following claims, including all equivalents, that are intended to define the scope of the claimed invention. Further, it should be noted that any aspect of any of the preferred embodiments described herein may be used alone or in combination with one another. Finally, persons skilled in the art will readily recognize that in preferred implementation, some, or all of the steps in the disclosed method are performed using a computer so that the methodology is computer implemented. In such cases, the resulting physical properties model may be downloaded or saved to computer storage.

LIST OF REFERENCE NUMBERS

1 Combine
2 Agricultural Production Machine
3 Working unit
4 Attachment

50 Supplied flow of harvested material
51 First flow of harvested material
52 Second flow of harvested material
53 Third flow of harvested material
54 Fourth flow of harvested material
55 Fifth flow of harvested material
56 Sixth flow of harvested material
57 Seventh flow of harvested material
58 Eighth flow of harvested material
6 Inclined conveyor
7 Threshing system
8 Threshing concave
9 Acceleration drum
10 Threshing drum
11 Deflection drum
12 Straw walker
13 Separating unit
14 Returns pan
15 Grain pan
16 Screening level
17 Screening level
18 Blower
19 Cleaning unit
20 Return auger
21 Grain tank
22 Rotor
23 Grid structure
24 Flaps
25 Capacitor
26 Sensor system
27 Coil
28 Measuring device
29 Voltage source
30 First voltage
31 Second voltage
32 Current
33 Electrode
34 Electrode
35 Element of the flow of harvested material
36 Length
37 Direction of motion
38 Front end of the screening level
39 Rear end of the screening level
40 Top part of the movable element
41 Bottom part of the movable element
42 First lost grain counter
43 Second lost grain counter
44 Returns grain counter
45 Control unit
46 Processor
47 Memory

The invention claimed is:

1. A sensor system for recording elements of a flow of harvested material, the sensor system comprising:
an oscillating circuit comprising at least one capacitive component with a capacitance and at least one inductive component with an inductance, wherein the oscillating circuit has a resonance frequency that depends on the capacitance and the inductance, wherein the at least one capacitive component is positioned in a region of the flow of the harvested material so that the capacitance of the at least one capacitive component is affected by the elements of the flow of the harvested material; and
a measuring device configured to determine the resonance frequency of the oscillating circuit;
wherein the sensor system is configured to deduce at least one property of the elements of the flow of harvested material based on the resonance frequency of the oscillating circuit;
wherein the at least one capacitive component comprises a flat capacitor;
wherein the flat capacitor is mounted at an edge of the flow of harvested material and is configured to detect the elements of the flow of harvested material flowing;
wherein the flat capacitor is attached to an outside of a separating rotor;
wherein the outside of the separating rotor has a grid structure;
wherein at least one flap is configured to close at least one opening in the grid structure; and
wherein the flat capacitor is attached to the at least one flap.

2. The sensor system of claim 1, wherein the sensor system is configured for an agricultural production machine.

3. The sensor system of claim 1, wherein the sensor system is configured, based on the resonance frequency of the oscillating circuit, to distinguish between grain elements and non-grain elements.

4. The sensor system of claim 3, wherein the non-grain elements comprise straw elements.

5. The sensor system of claim 1, wherein the measuring device is configured to determine the resonance frequency with a predetermined measuring frequency.

6. The sensor system of claim 5, wherein the resonance frequency is greater than 1 kHz.

7. The sensor system of claim 6, wherein the measuring frequency is less than one-tenth of the resonance frequency.

8. The sensor system of claim 7, wherein the measuring frequency multiplied by a length of the at least one capacitive component in a direction of movement of the flow of harvested material is greater than 2 m/s.

9. The sensor system of claim 7, wherein the measuring frequency multiplied by a length of the at least one capacitive component in a direction of movement of the flow of harvested material is greater than 10 m/s.

10. The sensor system of claim 7, wherein the measuring frequency multiplied by a length of the at least one capacitive component in a direction of movement of the flow of harvested material is greater than 25 m/s.

11. The sensor system of claim 1, wherein a surface normal of the flat capacitor is oriented substantially perpendicular to a direction of movement of the flow of harvested material.

12. The sensor system of claim 1, wherein the at least one capacitive component comprises an interdigital capacitor.

13. The sensor system of claim 1, wherein the measuring device is configured to use a sampling frequency in order to determine the resonance frequency; and
wherein the sampling is indicative of a frequency of determining one or both of a voltage or current for the oscillating circuit.

14. The sensor system of claim 13, wherein the sampling frequency is at least ten times as large as the resonance frequency.

15. The sensor system of claim 1, wherein a surface of the flat capacitor extends perpendicular to an outside of a separating rotor.

16. The sensor system of claim 15, wherein a surface normal of the flat capacitor is oriented substantially perpendicular to a direction of movement of the flow of the harvested material.

* * * * *